(12) United States Patent
Kanda et al.

(10) Patent No.: US 7,381,998 B2
(45) Date of Patent: Jun. 3, 2008

(54) SEMICONDUCTOR INTEGRATED CIRCUIT DEVICE

(75) Inventors: Ryo Kanda, Gunma (JP); Shigeaki Okawa, Tochigi (JP); Kazuhiro Yoshitake, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 287 days.

(21) Appl. No.: 10/949,569

(22) Filed: Sep. 24, 2004

(65) Prior Publication Data

US 2005/0087771 A1    Apr. 28, 2005

(30) Foreign Application Priority Data

Sep. 29, 2003    (JP)    ............ P. 2003-338865

(51) Int. Cl.
*H01L 29/861*    (2006.01)
(52) U.S. Cl. .............. 257/121; 257/175; 257/199; 257/551
(58) Field of Classification Search ........... 257/106, 257/121, 175, 199, 551
See application file for complete search history.

(56) References Cited

U.S. PATENT DOCUMENTS 5,150,068 A * 9/1992 Kawashima et al. ........ 327/145
5,864,253 A * 1/1999 Katakura et al. .......... 327/297
5,917,254 A * 6/1999 Lecce et al. ................ 307/125
7,002,687 B2 * 2/2006 Yao et al. ................... 356/402

FOREIGN PATENT DOCUMENTS

JP    6-104459    4/1994

* cited by examiner

*Primary Examiner*—George Fourson
*Assistant Examiner*—Joannie A Garcia
(74) *Attorney, Agent, or Firm*—Fish & Richardson P.C.

(57) ABSTRACT

A semiconductor integrated circuit device according to the present invention includes a diode in a second island region. The anode region of the diode and the dividing region in a first island region having a horizontal PNP transistor are electrically connected to each other; the cathode region of the diode and the collector region of a power NPN transistor are electrically connected to each other. Accordingly, the dividing region in the first island region having a horizontal PNP transistor becomes lower in potential than the dividing regions in the other island regions, so that the inflow of free carriers (electrons) to the horizontal PNP transistor can be prevented.

6 Claims, 7 Drawing Sheets

— Conventional structure
--- Metal wiring structure of the invention
—·— Diode connection structure of the invention

SEMICONDUCTOR INTEGRATED CIRCUIT DEVICE

BACKGROUND OF THE INVENTION

1. Field of the Invention

The present invention relates to a semiconductor integrated circuit device in which the malfunction of a motor drive circuit due to a parasitic effect is prevented.

2. Description of the Related Art

Conventional three-phase motor drivers have three parallel-connected transistors (Tr1-Tr2, Tr3-Tr4, and Tr5-Tr6) each connected in series between direct-current power supplies VCC and GND. Output terminals taken from between Tr1-Tr2, Tr3-Tr4, and Tr5-Tr6 are connected to a motor M. Thus, normal/back electromotive force is generated as the motor rotates/stops. It is proposed in the art to provide a structure in which a protective diode is connected between the collector and the emitter of the transistors to dissipate the electromotive force to a fixed potential, thereby protecting the interior of an IC including the series transistors (for example, refer to Patent Document: JP-A-6-104459, pp. 13-14, FIGS. 16-17).

Also a conventional normal/reverse rotation control circuit of a DC motor is disclosed (for example, refer to Nonpatent Document: Hirobumi Miura; "Mechatronics," Ohmsha, Ltd., pp. 204-205

In the conventional semiconductor integrated circuit devices, for example, during ON to OFF transition of a driver device, backward electromotive force (hereinafter, referred to as back electromotive force) is generated from a motor. Thus a negative potential is applied to the collector region of the driver device for driving the motor by the back electromotive force. Accordingly, free carriers (electrons) are generated from a PN junction between the emitter region and the base region of a parasitic transistor constructed of a driver device, a substrate, and a control device. The free carriers (electrons) flow from an island region having the driver device to the other island regions via the substrate. Particularly, when the free carriers (electrons) flow into the control device for controlling the driver device, the control device fails to function normally. This causes the driver device which should be in OFF action to make ON action to send an incorrect signal, thus interfering with the normal operation of the motor.

SUMMARY OF THE INVENTION

The present invention has been made in consideration of the foregoing problems. A semiconductor integrated circuit device according to the invention includes a semiconductor layer and a dividing region dividing the semiconductor layer into a plurality of island regions comprising at least an island region incorporating a driver device for driving a motor and at least another island region incorporating a control device for controlling the driver device. A diode device is formed in yet at least the another island region, an anode region of the diode device being electrically connected to the dividing region in the island region having the control device formed therein and a cathode region of the diode device being electrically connected to the island region having the driver device formed therein. Accordingly, the semiconductor integrated circuit device of the invention includes a diode device, in which the anode region of the diode device and the dividing region in the island region having the control device are electrically connected to each other, and the cathode region of the diode device and the island region having the driver device are electrically connected to each other. Accordingly, the dividing region in the island region having the control device becomes lower in potential than the dividing region in the other island regions by the back electromotive force of a motor. This prevents the free carriers (electrons) generated from the driver device from flowing into the control device to cause the malfunction of the control device.

In the semiconductor integrated circuit device according to the invention, the diode device is formed in a separated island region disposed to surround the island region having the driver device. Thus the periphery of the driver-device formed region in which free carriers (electrons) are generated by the back electromotive force of a motor is surrounded by the separated island region. The diode device is formed in the separated island region. Since the diode device also generates free carriers (electrons), the devices that generate the free carriers (electrons) can be formed close to each other, thus facilitating measures to the parasitic effect.

In the semiconductor integrated circuit device of the invention, the separated island region includes a diffusion region having supply potential. The periphery of the driver-device formed region having free carriers (electrons) generated by the back electromotive force of a motor is therefore surrounded by the separated island region. Since the diffusion region having supply potential is formed in the separated island region, the free carriers (electrons) generated from the driver device can be attracted in the vicinity thereof, so that the malfunction of the control device can be prevented.

The semiconductor integrated circuit device of the invention includes a semiconductor layer and a dividing region dividing the semiconductor layer into a plurality of island regions comprising at least an island region incorporating a driver device for driving a motor and at least another island region incorporating a control device for controlling the driver device. A dividing region in the island region having the driver device and a dividing region in the island region having the control device are electrically connected with each other. Therefore, the dividing region in the island region having the driver device and the dividing region in the island region having the control device can be substantially at the same potential. Thus the dividing region in the island region having the control device becomes lower in potential than the dividing regions in the other island regions by the back electromotive force of a motor. This prevents the free carriers (electrons) generated from the driver device from flowing into the control device to cause the malfunction of the control device.

The semiconductor integrated circuit device according to the invention includes at least an island region having a motor-driving device and an island region having a control device for controlling the driver device. A diode device is formed in the other island region. The anode region of the diode device is electrically connected to the dividing region in the island region having the control device. The cathode region of the diode device is electrically connected to the island region having the driver device. Accordingly, the island region having the control device is surrounded by the dividing region having a lower potential than the other island regions by the back electromotive force of a motor. This prevents the free carriers (electrons) generated from the driver device from flowing into the other island regions to cause the malfunction of the control device. Preventing the malfunction of the control device also prevents the malfunction of the driver device.

In the semiconductor integrated circuit device of the invention, the periphery of the island region having the motor-driving device is surrounded by the separated island region. The separated island region includes at least a diode device. Also the diode device generates free carriers (electrons) by the back electromotive force of the motor. In the invention, the driver device and the diode device which generate the free carriers (electrons) are formed close to each other. Thus the devices that generate the free carriers (electrons) by the back electromotive force of the motor are disposed in one region, thus facilitating the measure to the parasitic effect.

In the semiconductor integrated circuit device of the invention, the island region having the motor-driving device is surrounded by the separated island region. In the separated island region, the diode device and the diffusion region having supply potential are formed. Accordingly, the free carriers (electrons) generated from the driver device and the diode device by the back electromotive force of the motor can be attracted via the diffusion region formed in the separated island region. This prevents the malfunction of the control device and also the malfunction of the driver device.

In the semiconductor integrated circuit device of the invention, the dividing region in the island region having the motor-driving device and the dividing region in the island region having the control device for controlling the driver element are connected together with a wiring layer. Therefore, when free carriers (electrons) are generated from the driver device by the back electromotive force of the motor, the dividing region in the control-device formed region also has a negative potential as the dividing region in the driver-device formed region has a negative potential. As a result, the malfunction of the control device due to the free carriers (electrons) generated from the driver device can be prevented by the wiring structure on an upper surface of the semiconductor layer, as with the diode device.

DESCRIPTION OF THE PREFERRED EMBODIMENTS

A semiconductor integrated circuit device according to an embodiment of the present invention will be specifically described with reference to FIGS. 1 to 7.

Figure 1:
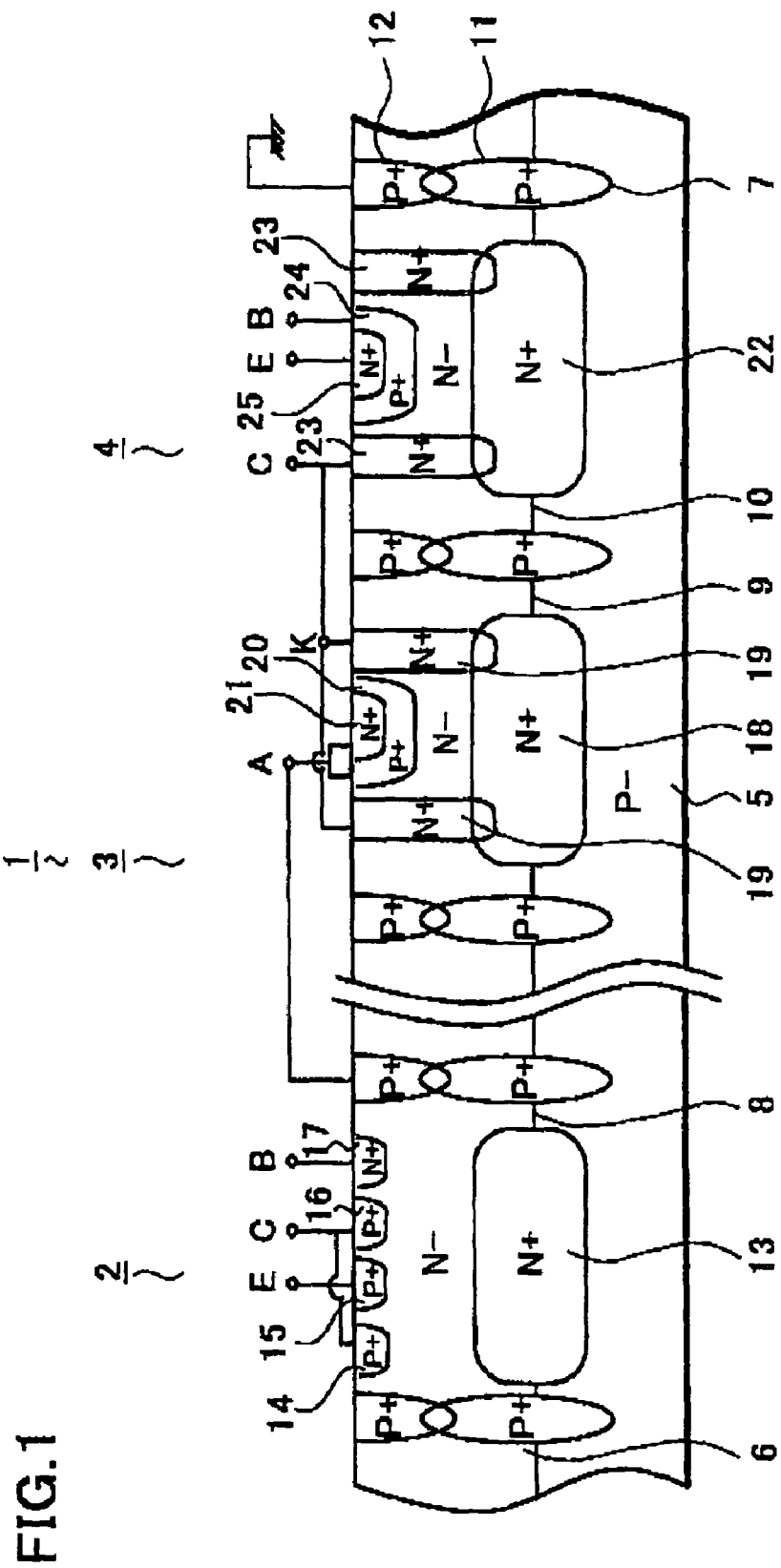
FIG. 1 is a cross-sectional view of a semiconductor integrated circuit device according to an embodiment of the present invention.
Figure 2:
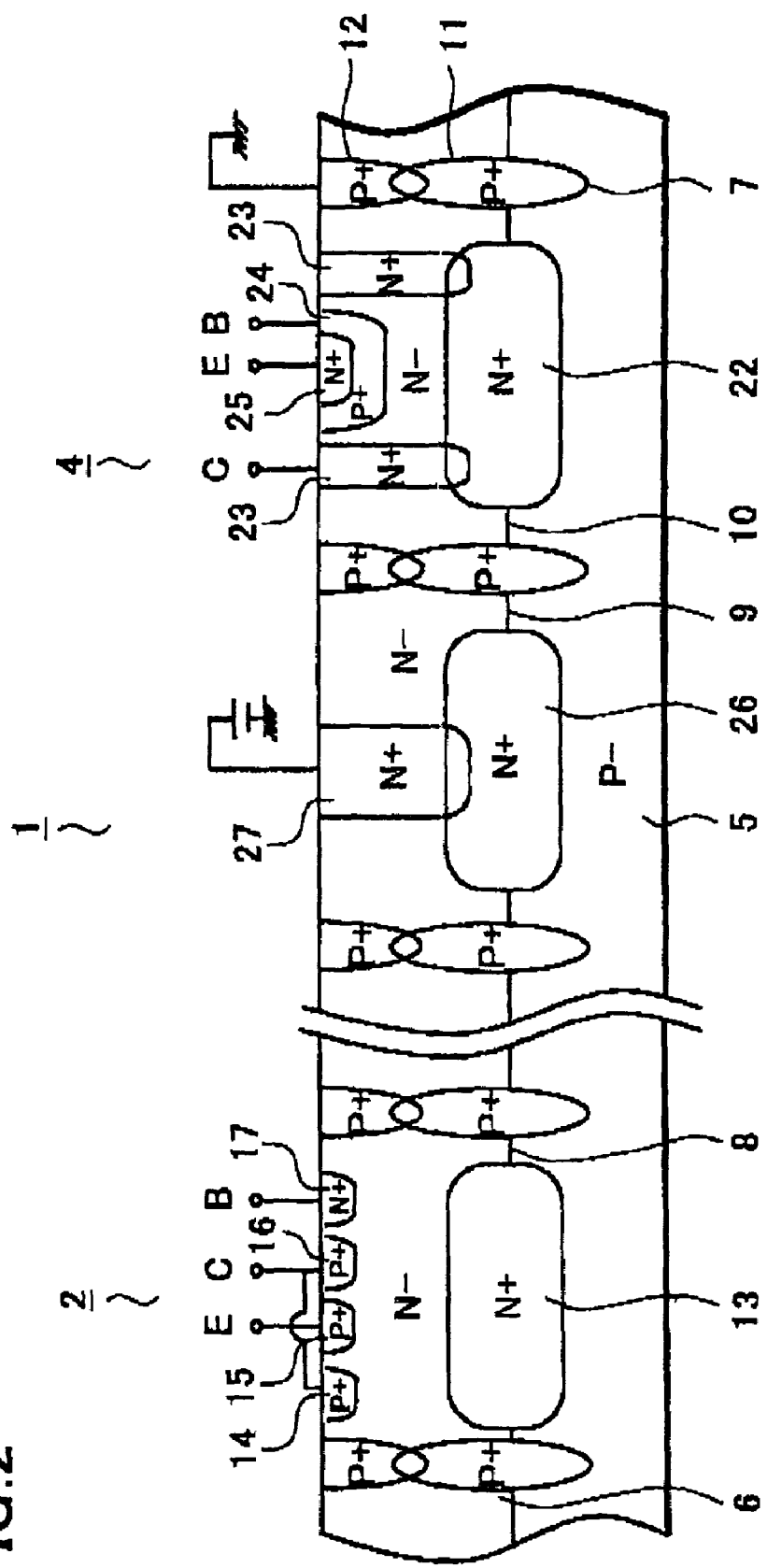
FIG. 2 is a cross-sectional view of a semiconductor integrated circuit device according to an embodiment of the present invention.
Figure 3A:
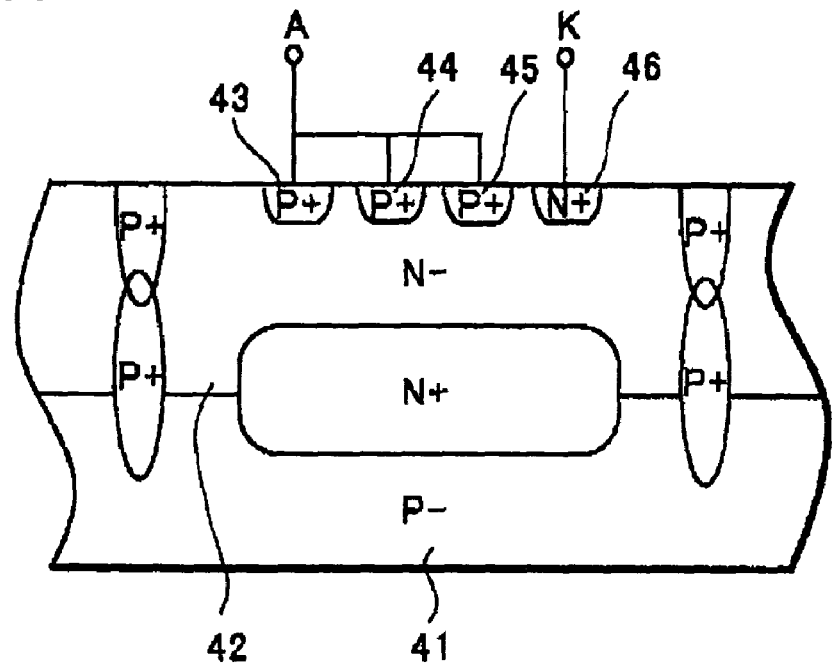
FIG. 3A is a cross-sectional view of a diode used in the semiconductor integrated circuit device according to the embodiment of the present invention.
Figure 3B:
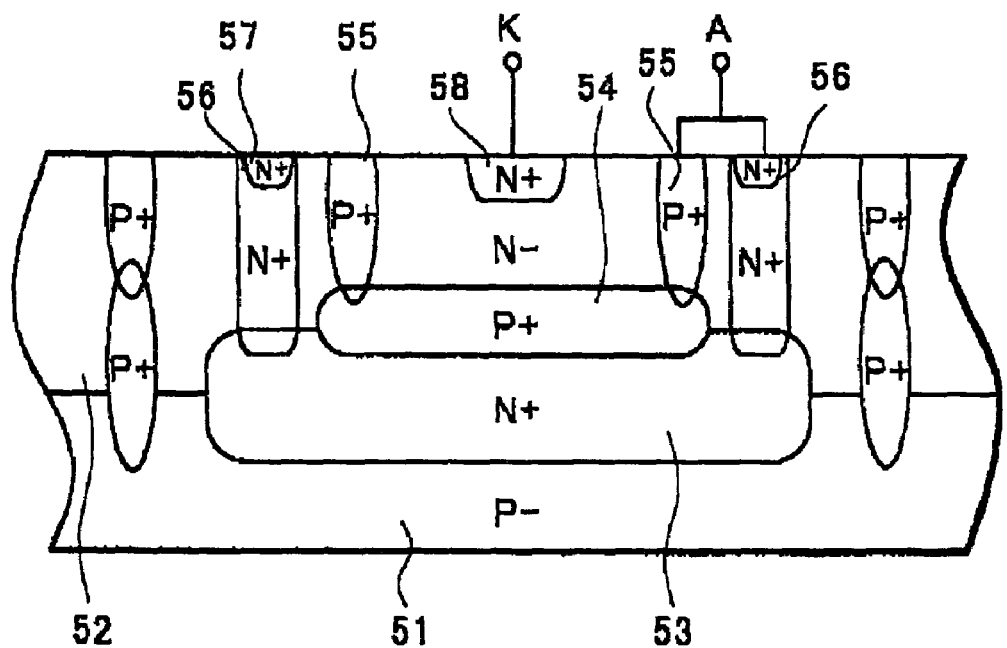
FIG. 3B is a cross-sectional view of a diode used in the semiconductor integrated circuit device according to the present invention.
Figure 4:
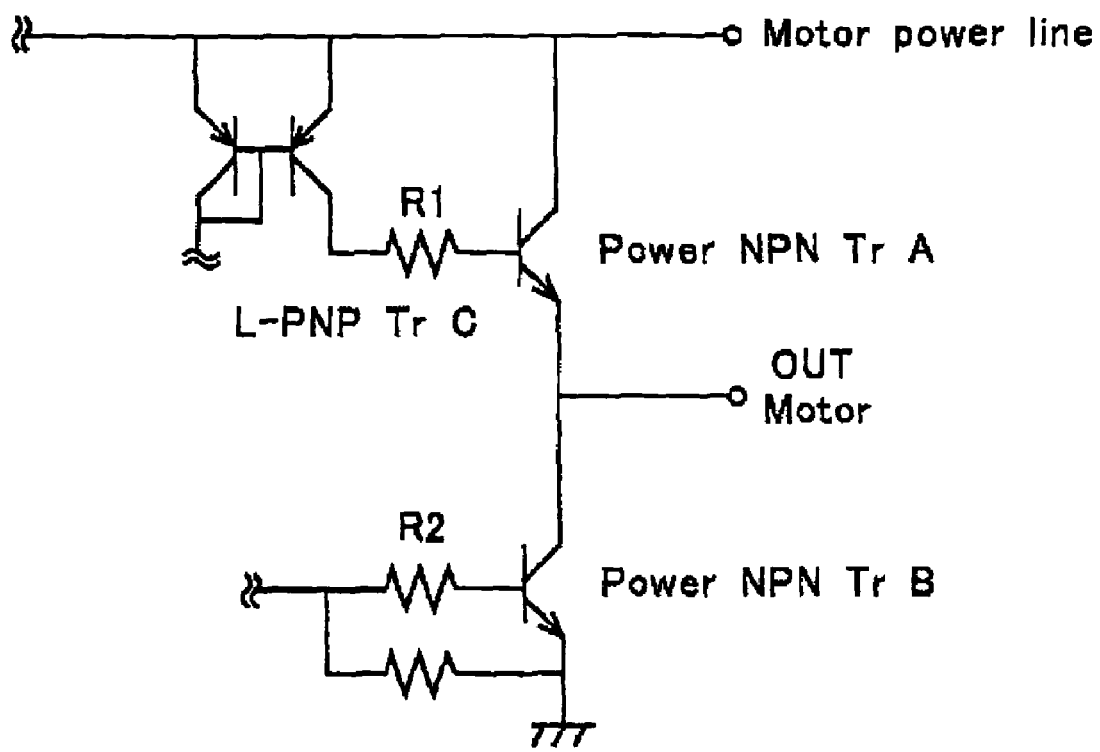
FIG. 4 is a circuit diagram of the semiconductor integrated circuit device according to the invention.
Figure 5:
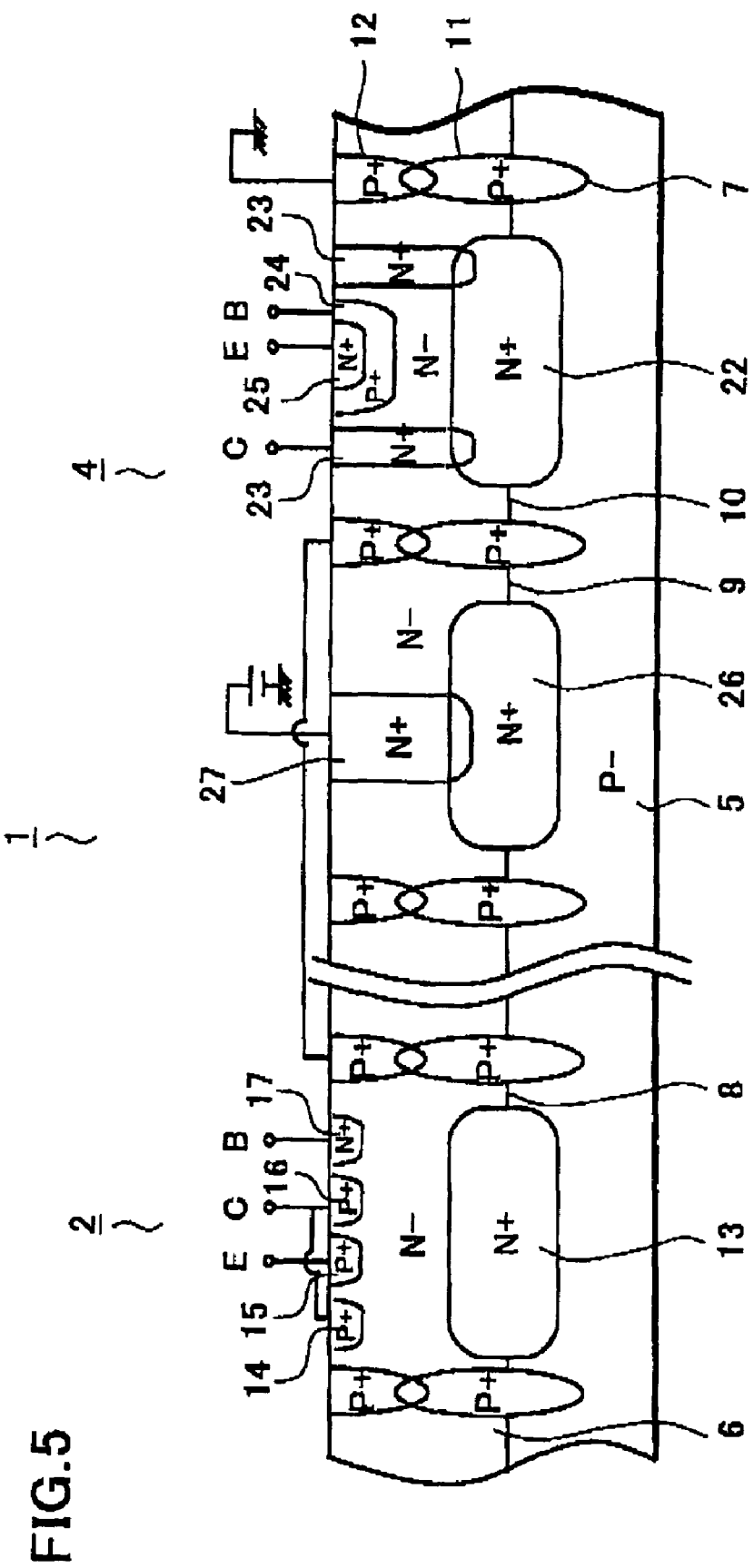
FIG. 5 is a cross-sectional view of a semiconductor integrated circuit device according to an embodiment of the present invention.

FIGS. 1, 2, and 5 are cross-sectional views of a semiconductor integrated circuit device according to the embodiment of the present invention. FIGS. 3A and 3B are cross-sectional views of diodes used in the semiconductor integrated circuit device according to the embodiment of the invention. FIG. 4 is part of the circuit diagram of the semiconductor integrated circuit device according to the embodiment of the invention. Although the semiconductor integrated circuit device according to the embodiment will be described for a power NPN transistor as motor-driving device, the embodiment of the invention is not limited to that. For example, a power MOS transistor may be used in place of the power NPN transistor. Although a horizontal PNP transistor device is shown in the cross-sectional views of FIGS. 1 and 2, an NPN transistor device etc. is disposed in the other region.

Referring to FIG. 1, an N-type epitaxial layer 6 in a thickness of 2 to 10 μm is formed on a P-type monocrystal silicon substrate 5. The substrate 5 and the epitaxial layer 6 are divided into a first island region 8, a second island region 9, and a third island region 10 by p-type dividing regions 7 which pass therethrough.

Each of the dividing regions 7 includes a first dividing region 11 diffusing vertically from the surface of the substrate 5 and a second dividing region 12 extending from the surface of the epitaxial layer 6. The first dividing region 11 and the second dividing region 12 are joined together to divide the substrate 5 and the epitaxial layer 6 into islands.

A semiconductor integrated circuit device 1 according to the embodiment has a horizontal PNP transistor 2 in the first island region 8, a diode 3 in the second island region 9, and a power NPN transistor 4 in the third island region 10. Although not shown, an LOCOS oxide film, a silicon oxide film, etc. are deposited on the epitaxial layer 6. A barrier metal layer and an aluminum layer are deposited through contact holes in the silicon oxide film etc., and then an electrode is formed. The devices 2, 3, and 4 formed in the first island region 8, the second island region 9, and the third island region 10 will be described hereinbelow.

The horizontal PNP transistor 2 formed in the first island region 8 will first be described. An N-type embedded diffusion region 13 is formed at the boundary between the substrate 5 and the epitaxial layer 6, as shown in the drawing. The epitaxial layer 6 used as base region has P-type diffusion regions 14, 15, and 16 and an N-type diffusion region 17 extending from the surface. For example, the P-type diffusion region 15 is used as emitter region and P-type diffusion regions 14 and 16 are used as collector region. Although the P-type diffusion regions 14 and 16 are separated in FIG. 1, they are actually integrated so as to surround the P-type diffusion region 15 of the emitter region. The N-type diffusion region 17 is used as base leading region. Thus the horizontal PNP transistor 2 is constructed.

The diode 3 formed in the second island region 9 will then be described. An N-type embedded diffusion region 18 is formed at the boundary between the substrate 5 and the epitaxial layer 6, as shown in FIG. 1. N-type diffusion regions 19 extend from the surface of the epitaxial layer 6. The N-type diffusion regions 19 connect to the N-type embedded diffusion region 18. A P-type diffusion region 20 extending from the surface of the epitaxial layer 6 is formed in the region between the N-type diffusion regions 19. An N-type diffusion region 21 is formed on the surface of the P-type diffusion region 20.

In this embodiment, the P-type diffusion region 20 is used as anode region. The P-type diffusion region 20 and the N-type diffusion region 21 are shorted on the upper surface of the epitaxial layer 6 to form an anode electrode. This prevents the parasitic effect between the P-type diffusion region 20 and the N-type diffusion region 21. The N-type epitaxial layer 6 and the N-type diffusion region 18 and 19 are used as a cathode region. Thus a cathode electrode is formed on the surface of the epitaxial layer 6. With this construction, diode 3 is formed.

In the embodiment, the device structure of the other island region of the semiconductor integrated circuit device 1 can be used in forming the diode 3, as shown in the drawing. The structure of the diode 3 is formed with the structure of the electrode and wiring on the upper surface of the device. Accordingly, the diode 3 may have the same structure as the horizontal PNP transistor, as shown in FIG. 3A. In that case, P-type diffusion regions 43, 44, and 45 are used as anode region to form an anode electrode on the upper surface of an epitaxial layer 42. The N-type epitaxial layer 42 and an N-type diffusion region 46 are used as cathode region. Thus a cathode electrode is formed on the upper surface of the epitaxial layer 42.

The diode 3 can be formed with the structure shown in FIG. 3B. In that case, a P-type embedded diffusion region 54 and a P-type diffusion region 55 are used as anode region. Thus the P-type diffusion region 55 and an N-type diffusion region 57 are short-circuited to form an anode electrode on an epitaxial layer 52. This prevents leak current to a substrate 51 due to a parasitic PNP transistor constructed of an emitter region formed of the P-type diffusion regions 54 and 55, a base region formed of N-type diffusion regions 53, 56, and 57, and a collector region formed of a P-type substrate 51. The N-type epitaxial layer 52 and an N-type diffusion region 58 are used as cathode region. Thus a cathode electrode is formed on the upper surface of the epitaxial layer 52.

The power NPN transistor 4 formed on the third island region 10 will then be described. As shown in FIG. 1, an N-type embedded diffusion region 22 is formed at the boundary between the substrate 5 and the epitaxial layer 6. N-type diffusion regions 23 extend from the surface of the epitaxial layer 6. The N-type diffusion regions 23 connect to the N-type embedded diffusion region 22. A P-type diffusion region 24 extending from the surface of the epitaxial layer 6 is formed in the region between the N-type diffusion regions 23. An N-type diffusion region 25 is formed on the surface of the P-type diffusion region 24. In this embodiment, the N-type epitaxial layer 6 is used as collector region, and the N-type embedded diffusion region 22 and the N-type diffusion region 23 are used as collector leading region. The P-type diffusion region 24 is used as base region and the N-type diffusion region 25 as emitter region.

This embodiment has been described for the case in which the second island region 9 is disposed so as to surround the third island region 10 which has the power NPN transistor 4 serving as motor driving device and in which a diode device is formed in the second island region 9. However, the embodiment of the invention is not limited to that. For example, the structure shown in FIG. 2 is possible. With this structure, in the second island region 9, an N-type embedded diffusion region 26 is formed at the boundary between the substrate 5 and the epitaxial layer 6. An N-type diffusion region 27 extends from the surface of the epitaxial layer 6.

The N-type diffusion region 27 connects to the N-type embedded diffusion region 26. Supply voltage is applied to the N-type diffusion region 27. Accordingly, when the back electromotive force of a motor is applied to the power NPN transistor 4, free carriers (electrons) generated from the power NPN transistor 4 can be attracted from the N-type diffusion regions 26 and 27. The cross-sectional views of FIGS. 1 and 2 show the case in which the diode 3 is formed and the case in which the diffusion regions 26 and 27 to which supply voltage is applied are formed, respectively. However, both of them may be formed in the second island region 9.

In this embodiment, an NPN transistor carrying a main current of about several milliamperes is referred to as an NPN transistor; an NPN transistor carrying a main current of about several amperes is referred to as a power NPN transistor.

FIG. 4 shows part of a circuit diagram of the semiconductor integrated circuit device 1 according to the embodiment, serving as driver IC for driving a motor. For example, the power line for driving a motor connects to the collector electrode of a power NPN transistor A serving as a motor-driving device. The emitter electrode of the power NPN transistor A and the output terminal of the motor are connected together. The collector electrode of a horizontal PNP transistor C serving as control device and the base electrode of the power NPN transistor A are connected via a resistor R1. The emitter electrode of the horizontal PNP transistor C connects to the power line. The base electrode connects to, for example, the base electrode of the other horizontal PNP transistor formed as current mirror circuit and then connects to the power line via the horizontal PNP transistor.

In this embodiment, the diode 3 is formed in the second island region 9, as described above. The second island region 9 is disposed so as to surround the third island region 10 having the power NPN transistor 4. Alternatively, the second island region 9 is disposed in the vicinity of the third island region 10. The anode region of the diode 3 in the second island region 9 is electrically connected to the dividing region 7 in the first island region 8 having the horizontal PNP transistor 2 by the wiring on the upper surface of the epitaxial layer 6. The cathode region of the diode 3 is electrically connected to the collector region of the power NPN transistor 4 by the wiring on the upper surface of the epitaxial layer 6.

With such a wiring structure, during ON to OFF transition of the power NPN transistor 4 serving as driver device, for example, back electromotive force is generated from the motor and is applied to the power NPN transistor 4. Therefore, a negative potential of, for example, about −2 V is applied to the collector region of the power NPN transistor 4. The P-type substrate 5 is grounded via the dividing region 7 that divides the third island region 10. Accordingly, forward bias is applied to the junction (hereinafter, referred to as a parasitic junction) between the emitter region and the base region of a parasitic NPN transistor formed of the N-type embedded diffusion region 22 of the power NPN transistor 4, the P-type substrate 5, and the N-type embedded diffusion region 13 of the horizontal PNP transistor 2. As a result, free carriers (electrons) are generated.

The embodiment has been described for the case in which a negative potential of about −2 V is applied to the collector region of the power NPN transistor 4 by the back electromotive force of the motor. However, the embodiment of the invention is not limited to that.

The cathode region of the diode 3 also has a negative potential of, for example, about −2 V by the back electromotive force of the motor. At the same time, the substrate 5 is grounded. Accordingly, forward bias is applied to the parasitic junction between the emitter region and the base region of a parasitic NPN transistor formed of the N-type embedded diffusion region 18 of the diode 3, the P-type substrate 5, and the N-type embedded diffusion region 13 of the horizontal PNP transistor 2. As a result, free carriers (electrons) are generated.

However, since the embodiment has the above described wiring structure, the anode region of the diode 3 is grounded and the cathode region has a negative potential of, e.g. about −2 V by the back electromotive force of the motor. Accordingly, forward bias is applied to the PN junction of the diode 3 to turn on the diode 3, so that a negative potential of, e.g. about −1.3 V is applied to the anode electrode. The anode electrode of this embodiment electrically connects to the dividing region 7 in the first island region 8 with a wiring layer. As a result, the first island region 8 is surrounded by the dividing region 7 having a negative potential of, e.g. about −1.3 V.

Briefly, this embodiment prevents free carriers (electrons) generated from the diode 3 and the parasitic junction of the power NPN transistor 4 from flowing into the horizontal PNP transistor 2 through the substrate 5. As in the horizontal PNP transistor 2, the potential of the dividing region 7 in the island region having a small-signal device for controlling a driver device is made lower than that for the dividing region 7 in the other island regions. Thus the free carriers (electrons) generated from the diode 3 and the power NPN transistor 4 flow into the other island regions surrounded by the grounded dividing regions 7. Accordingly, free carrier (electron) barely flows into the base region of the horizontal PNP transistor 2 and as such, the horizontal PNP transistor 2 is not turned on in OFF mode. As a result, in the embodiment, the power NPN transistor 4 serving as driver device can be prevented from turning on in OFF mode by the ON action of the horizontal PNP transistor 2 serving as control device due to the parasitic effect.

In the embodiment, the use of, e.g., aluminum wiring on the upper surface of the epitaxial layer 6 offers the same effects as in the case of using the diode 3, as shown in FIG. 5.

Specifically speaking, the dividing region 7 in the first island region 8 having the horizontal PNP transistor 2 and the dividing region 7 in the third island region 10 having the power NPN transistor 4 are electrically connected by aluminum wiring on the upper surface of the epitaxial layer 6. A negative potential of, e.g. about −2 V is applied to the collector region of the power NPN transistor 4 serving as driver device by the back electromotive force of the motor at ON to OFF transition of the power NPN transistor 4. The p-type substrate 5 is grounded via the dividing region 7 that partitions the third island region 10. The parasitic junction of the power NPN transistor 4 formed of the P-type substrate 5, the N-type epitaxial layer 6, and the N-type embedded diffusion region 22 is forward-biased. As a result, free carriers (electrons) are generated.

Accordingly, the parasitic junction of the power NPN transistor 4 is forward-biased and the dividing region 7 that partitions the third island region 10 has a negative potential of, e.g. about −1.3 V. In this embodiment, the dividing region 7 in the third island region 10 having the power NPN transistor 4 and the dividing region 7 in the first island region 8 having the horizontal PNP transistor 2 are electrically connected by aluminum wiring. Although the voltage drops owing to the aluminum wiring, a voltage of about 1.0 to −1.3 V is applied to the dividing region 7 in the first island region 8 having the horizontal PNP transistor 2.

In other words, a potential lower than that of the dividing regions 7 in the other grounded island regions is applied to the dividing region 7 in the first island region 8 having the horizontal PNP transistor 2. Consequently, the inflow of free carriers (electrons) into the first island region 8 can be prevented using the diode 3, as described above, so that the malfunction of the horizontal PNP transistor 2 by the parasitic effect can be prevented. Also in this embodiment, the malfunction of the power NPN transistor 4 serving as motor-driving device can be prevented as with the diode 3.

In addition, since the dividing region 7 in the island region that is desired to be prevented from a malfunction by the parasitic effect is electrically connected to the dividing region 7 in the third island region 10 by aluminum wiring, the inflow of the free carriers (electrons) can be prevented. Also in this embodiment, the N-type embedded diffusion region 26 and the N-type diffusion region 27 having supply potential are formed in the second island region 9 which is disposed to surround the third island region 10, so that the free carriers (electrons) generated from the parasitic junction can be attracted efficiently.

Figure 6:
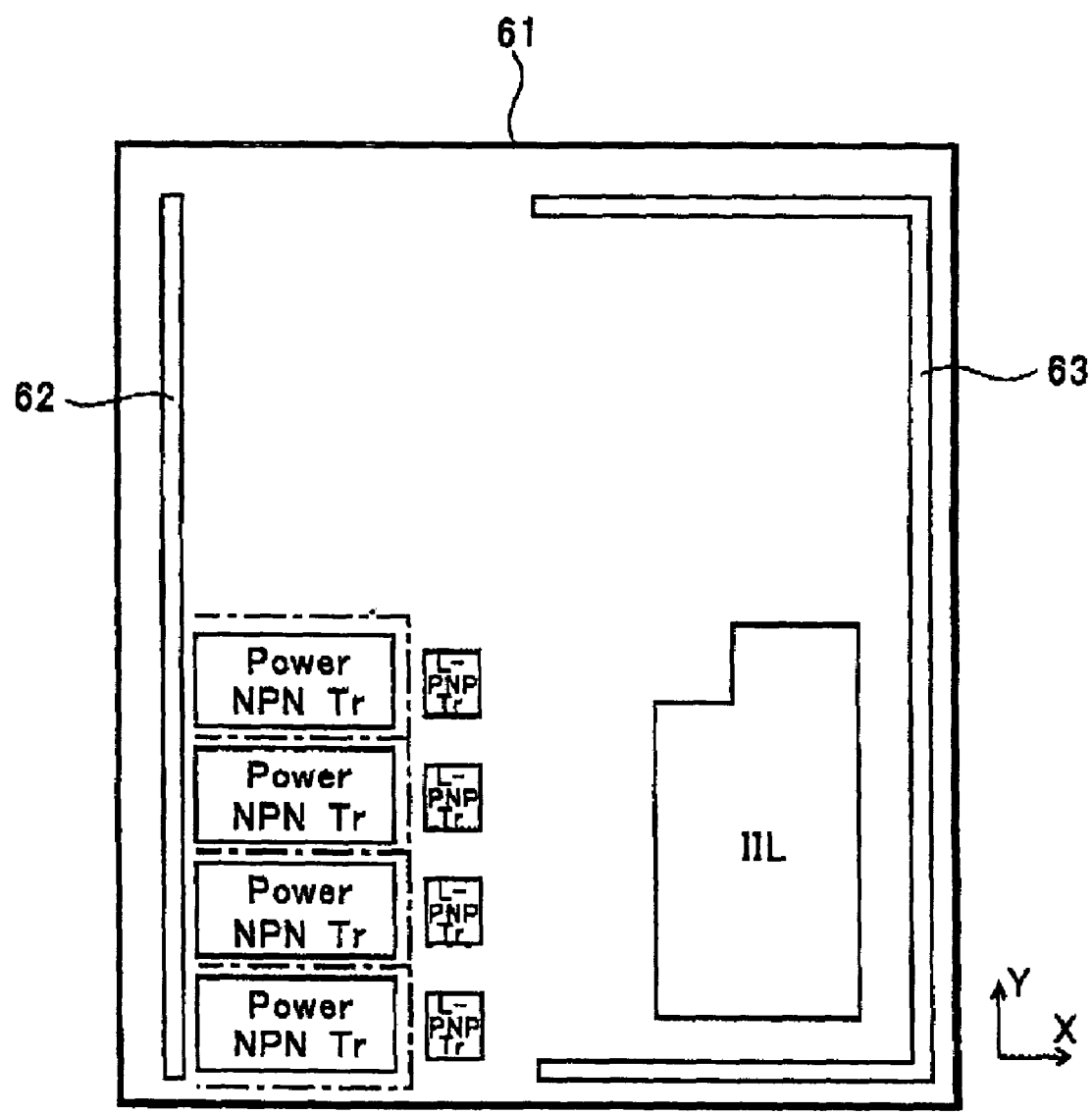
FIG. 6 is a top view of a semiconductor integrated circuit device according to an embodiment of the present invention.
Figure 7A:
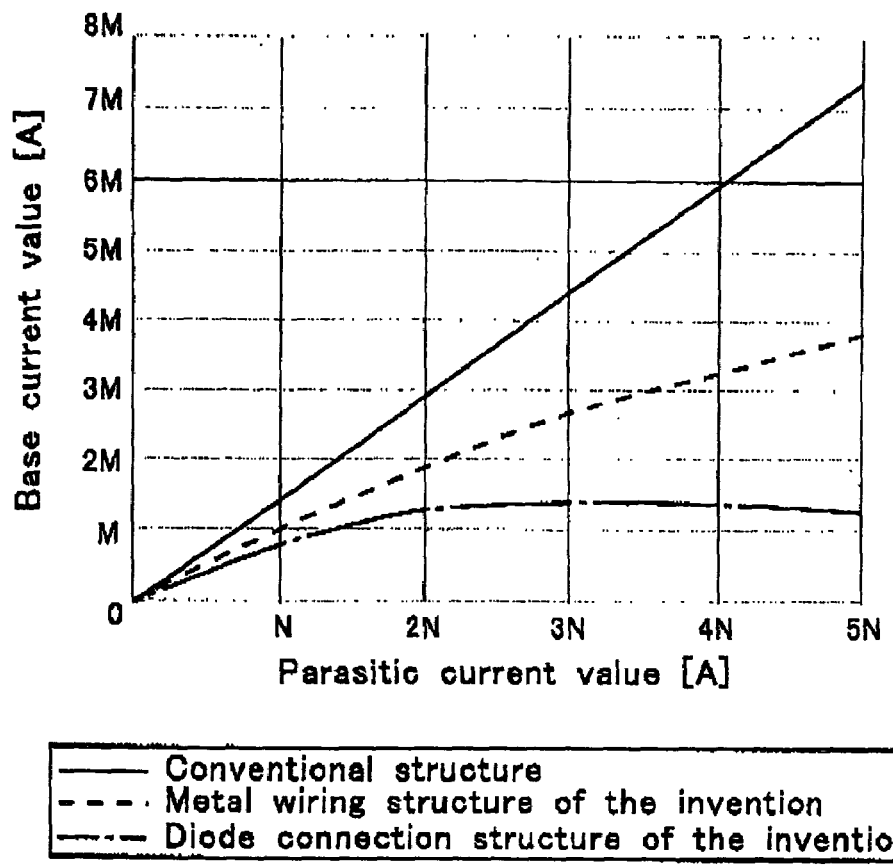
FIG. 7A is a graph presenting the relationship between the parasitic current value of a power NPN transistor and the base current value of a horizontal PNP transistor for a device structure.
Figure 7B:
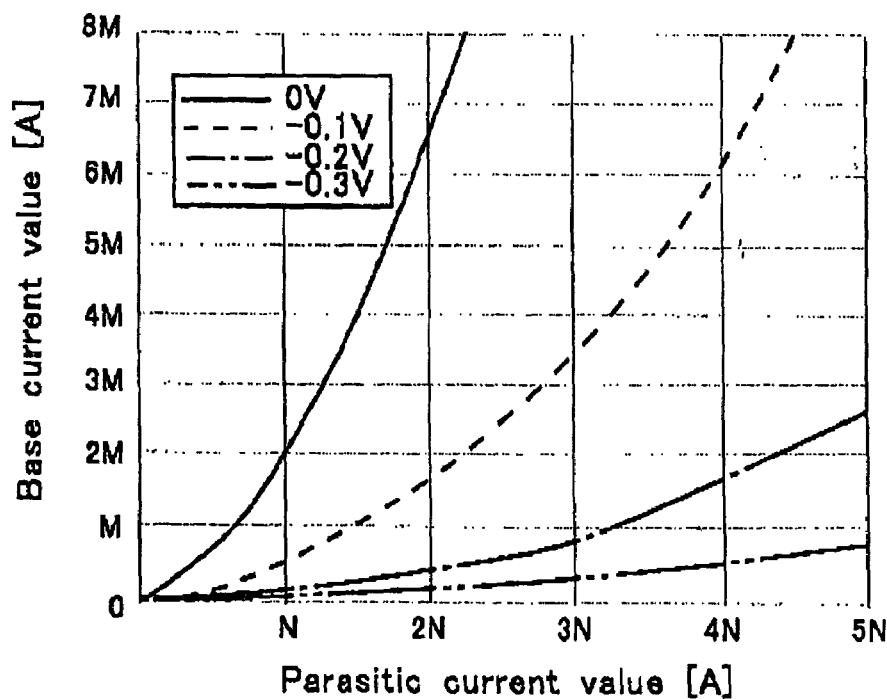
FIG. 7B is a graph presenting the relationship between the parasitic current value of a power NPN transistor and the base current value of a horizontal PNP transistor for applied potential.

FIG. 6 is part of the top view of the semiconductor integrated circuit device 1 of the embodiment of the present invention. FIGS. 7A and 7B are characteristic diagrams presenting the relationship between the parasitic current value of the driver device and the base current value of the control device of the embodiment of the invention.

As shown in FIG. 6, in this embodiment, for example, a ground line 62 for the power NPN transistors serving as control device is disposed on the left side of a semiconductor chip 61. Four power NPN transistors are disposed along the Y-axis in the vicinity of the ground line 62. In this embodiment, separated island regions are disposed so as to surround the power NPN transistors, as shown by alternate long and short dashed lines.

A ground line 63 for the other devices is disposed on the right side and the top and bottom sides of the semiconductor chip 61. An integrated injection logic (IIL) is disposed in the vicinity of the ground line 63. Between the region of the power NPN transistors and the region of the IIL, four horizontal PNP transistors which send control signals to the power NPN transistors are disposed along the Y-axis. As shown in the drawing, the power NPN transistors and the horizontal PNP transistors are partitioned by the separated island regions.

FIG. 7A shows the relationship between the base current value of the horizontal PNP transistors when free carriers (electrons) are generated from the parasitic junction and the parasitic current value of the power NPN transistors with the arrangement of FIG. 6, plotting the base current value in the Y-axis and the parasitic current value in the X-axis. The solid line indicates a conventional structure having no diode or no metal wiring. The dotted line shows a case having no diode and in which the dividing regions of the horizontal PNP transistors and the dividing regions of the power NPN transistors are connected by the above-described wiring. The alternate long and short dashed line indicates a case having diodes in the separated island regions and in which the diodes and the dividing regions of the horizontal PNP transistors and the collector regions of the power NPN transistors are connected by the above-described wiring.

As shown in the drawing, with the conventional structure indicated by the solid line, the base current of the horizontal PNP transistor increases as the parasitic current to the power NPN transistors increases. In other words, with the conventional structure, the base current value of the horizontal PNP transistors increases with an increase in the generation of free carriers (electrons) from the parasitic junction of the power NPN transistor. Since a base current higher than a specified amount flows, the horizontal PNP transistor turns on in OFF mode. This malfunction of the horizontal PNP transistor activates the power NPN transistor to send incorrect signals to the motor, thereby interfering with normal operation of the motor.

According to the embodiment, a potential lower than that for the other island regions is applied to the dividing region in the island regions having the horizontal PNP transistors which may cause malfunction due to free carriers (electrons), shown by the dotted line and the alternate long and short dashed line. This prevents an increase in the base current value in the horizontal PNP transistors with an increase in the free carriers (electrons) generated from the power NPN transistors. Thus the malfunction of the horizontal PNP transistor due to the free carriers (electrons) can be prevented. As shown in the graph, with the use of diode devices, the dividing region of the horizontal PNP transistors has a lower potential than the other dividing regions. This prevents an increase in the base current value of the horizontal PNP transistors due to the free carriers (electrons).

FIG. 7B shows a change in the base current value of the horizontal PNP transistors with the arrangement of respective devices in FIG. 6 when the potential applied to the dividing regions in the island regions of the horizontal PNP transistors is varied. FIG. 7B shows data when voltage is applied directly to the dividing regions in the island regions of the horizontal PNP transistors, plotting the base current value of the horizontal PNP transistors when free carriers (electrons) are generated from the parasitic junction in the Y-axis and the parasitic current value of the power NPN transistors in X-axis.

As shown in the graph, when the dividing region is grounded (0 V), as indicated by the solid line, the power NPN transistor 4 is surrounded by the dividing region having the same potential as the dividing regions in the other island regions. The base current value of the horizontal PNP transistor therefore increases as the parasitic current to the power NPN transistor increases. On the other hand, when a voltage of −0.1 V is applied to the dividing region, as indicated by the dotted line, it becomes lower in potential than the dividing regions in the other island regions. Thus the base current value in the horizontal PNP transistor decreases. Likewise, the potential applied to the dividing region is set at −0.2 V and −0.3 V, as indicated by the alternate long and short dashed line and the chain double-dashed line, respectively. In that case, the island region of the horizontal PNP transistor is surrounded by a dividing region lower in potential than the other island regions. This further decreases the base current value of the horizontal PNP transistor.

In other words, as shown in FIGS. 7A and 7B, the embodiment is constructed such that a lower potential is applied to the dividing region in the island region of a device which may have a malfunction due to the free carriers (electrons) generated from the parasitic junction of the driver device when back electromotive force of the motor generates than the other island regions. This prevents the free carriers (electrons) generated from the driver device by the back electromotive force of the motor from flowing into the island region of the control device to cause a malfunction. According to the embodiment, a desired dividing region has a lower potential than the other dividing regions by using the diode and the metal wiring. Since the N-type diffusion region having supply potential is formed in the separated island region having a diode, the free carriers (electrons) can be attracted. This prevents the malfunction of the control device more effectively.

Although this embodiment has been described for the case in which the diode is incorporated in a semiconductor integrated circuit device formed of the same substrate, the embodiment of the invention is not limited that. For example, the use of an externally connected separate diode can offer the similar advantages. Another structure is also possible in which the potential of the dividing region in the island region having a device affected by the parasitic effect can be lower in potential than the dividing regions of the other island regions. It is to be understood that various modifications may be made in the embodiment of the invention without departing from the spirit and scope thereof.

What is claimed is:

1. A semiconductor integrated circuit device comprising:
a semiconductor layer;
a dividing region dividing the semiconductor layer into island regions comprising a first island region incorporating a driver device for driving a motor and a second island region incorporating a control device for controlling the driver device, and
a diode device formed in a third island region, wherein an anode region of the diode device is electrically connected to the dividing region in the second island region having the control device and a cathode region of the diode device is electrically connected to the first island region having the driver device.

2. The semiconductor integrated circuit device according to claim 1, wherein the diode device is formed in the vicinity of the driver device.

3. The semiconductor integrated circuit device according to claim 1 or 2, wherein the diode device is formed in the third island region that surrounds the first island region having the driver device.

4. The semiconductor integrated circuit device according to claim 3, wherein the third island region includes a diffusion region having supply potential.

5. A semiconductor integrated circuit comprising:
a semiconductor layer; and
dividing regions dividing the semiconductor layer into island regions comprising a first island region incorporating a driver device for driving a motor and a second island region incorporating a control device for controlling the driver device,
wherein a first dividing region that surrounds the first island region having the driver device and a second dividing region that surrounds the second island region having the control device are electrically connected with each other by metal wiring on an upper surface of the semiconductor layer.

6. The semiconductor integrated circuit device according to claim 5, wherein a diffusion region having supply potential is formed in a separated island region that surrounds the first island region having the driver device.

* * * * *